United States Patent
Naka et al.

(10) Patent No.: US 6,756,249 B2
(45) Date of Patent: Jun. 29, 2004

(54) METHOD OF MANUFACTURING ORGANIC ELECTROLUMINESCENT DEVICE

(75) Inventors: Shigeki Naka, Nei-gun (JP); Tadahiro Echigo, Uozu (JP); Hiroyuki Okada, Toyama (JP); Hiroyoshi Onnagawa, Toyama (JP)

(73) Assignee: President of Toyama University, Toyama (JP)

( * ) Notice: Subject to any disclaimer, the term of this patent is extended or adjusted under 35 U.S.C. 154(b) by 140 days.

(21) Appl. No.: 10/268,791

(22) Filed: Oct. 11, 2002

(65) Prior Publication Data

US 2003/0087464 A1 May 8, 2003

(30) Foreign Application Priority Data

Oct. 15, 2001 (JP) .................................... 2001-316871

(51) Int. Cl.[7] .................... H01L 51/40; H01L 21/00; H01L 21/31
(52) U.S. Cl. .................... 438/99; 438/21; 438/30; 438/69; 438/82; 438/780; 438/782
(58) Field of Search .................... 438/21, 30, 69, 438/82, 99, 780, 782

(56) References Cited

U.S. PATENT DOCUMENTS

| | | | | |
|---|---|---|---|---|
| 3,768,902 A | * | 10/1973 | Van Dorn | |
| 4,060,426 A | * | 11/1977 | Zinchuk | |
| 4,343,881 A | * | 8/1982 | Sher et al. | |
| 5,882,829 A | * | 3/1999 | Hsieh et al. | |
| 6,310,360 B1 | * | 10/2001 | Forrest et al. | |
| 6,440,877 B1 | * | 8/2002 | Yamazaki et al. | |
| 6,514,632 B1 | * | 2/2003 | Woo et al. | |
| 6,515,298 B2 | * | 2/2003 | Forrest et al. | |
| 6,515,417 B1 | * | 2/2003 | McConnelee et al. | |
| 6,534,329 B2 | * | 3/2003 | Heeger et al. | |
| 2002/0079832 A1 | * | 6/2002 | Van Tongeren et al. | |
| 2002/0127877 A1 | * | 9/2002 | Shibata et al. | |

FOREIGN PATENT DOCUMENTS

| | | |
|---|---|---|
| JP | 7-53953 | 2/1995 |
| JP | 8-100038 | 4/1996 |
| JP | 9-63770 | 3/1997 |
| JP | 9-255774 | 9/1997 |
| JP | 2000-507029 | 6/2000 |
| JP | 2001-232251 | 8/2001 |
| JP | 2001-237070 | 8/2001 |
| JP | 2001-257076 | 9/2001 |
| JP | 2001-357974 | 12/2001 |

* cited by examiner

*Primary Examiner*—John F. Niebling
*Assistant Examiner*—Stanetta Isaac
(74) *Attorney, Agent, or Firm*—Oblon, Spivak, McClelland, Maier & Neustadt, P.C.

(57) ABSTRACT

A method of manufacturing an organic electroluminescent device has the steps of forming a first electrode on a substrate, preparing a solution containing a hole transport organic material, an electron transport organic material and a luminescent organic material, followed by spraying the solution onto the first electrode by using a pressurized gas so as to form an organic thin film layer, and forming a second electrode on the organic thin film layer.

11 Claims, 3 Drawing Sheets

METHOD OF MANUFACTURING ORGANIC ELECTROLUMINESCENT DEVICE

CROSS-REFERENCE TO RELATED APPLICATIONS

This application is based upon and claims the benefit of priority from the prior Japanese Patent Application No. 2001-316871, filed Oct. 15, 2001, the entire contents of which are incorporated herein by reference.

BACKGROUND OF THE INVENTION

1. Field of the Invention

The present invention relates to a method of manufacturing an organic electroluminescent device.

2. Description of the Related Art

An organic electroluminescent device is constructed to have an organic thin film layer containing a hole transport organic material, a luminescent organic material, and an electron transport organic material sandwiched between two electrodes. Where the organic electroluminescent device is used as a display device, a pattern of the organic thin film layer is formed in accordance with the color of the emitted light.

The conventional patterning method of an organic thin film layer includes, for example, a masked vacuum deposition method, a screen-printing method, a stamping method, a masked dye diffusion method, an ink jet printing method, and a micro gravure method.

On the other hand, in the case of forming an organic thin film layer having a large area, any of the conventional methods referred to above gives rise to the problem that a large-scale apparatus is required, or the film-forming time is long.

BRIEF SUMMARY OF THE INVENTION

An object of the present invention is to provide a method of manufacturing in a short time an organic electroluminescent device including an organic thin film layer of large area.

According to a first aspect of the present invention, there is provided a method of manufacturing an organic electroluminescent device, comprising the steps of: forming a first electrode on a substrate; forming on the first electrode at least one organic thin film layer containing at least one kind of a material selected from the group consisting of a hole transport organic material, an electron transport organic material, and a luminescent organic material; and forming a second electrode on the organic thin film layer; wherein the step of forming at least one organic thin film layer comprising the steps of: preparing a solution containing at least one kind of a material selected from the group consisting of a hole transport organic material, an electron transport organic material, and a luminescent organic material; and spraying the solution onto the first electrode by using a pressurized gas.

In another embodiment of the present invention, it is possible to form one organic thin film layer by the steps of: preparing one kind of a solution containing a hole transport organic material, an electron transport organic material, and a luminescent organic material; and spraying the solution onto the first electrode by using a pressurized gas.

In anther embodiment of the present invention, it is possible to form two organic thin film layers of a lower layer and an upper layer by the steps of: preparing a first solution containing a hole transport organic material and a second solution containing an electron transport organic material and a luminescent organic material; and spraying in a predetermined order the first and second solutions onto the first electrode by using a pressurized gas.

In another embodiment of the present invention, it is possible to form two organic thin film layers of a lower layer and an upper layer by the steps of: preparing a first solution containing a hole transport organic material and a luminescent organic material and a second solution containing an electron transport organic material; and spraying in a predetermined order the first and second solutions onto the first electrode by using a pressurized gas.

In another embodiment of the present invention, it is possible to form three organic thin film layers of a lower layer, an intermediate layer, and an upper layer by the steps of: preparing first, second and third solutions containing a hole transport organic material, a luminescent organic material and an electron transport organic material, respectively; and spraying in a predetermined order the first to third solutions onto the first electrode by using a pressurized gas.

Further, in still another embodiment of the present invention, it is possible to form two or more organic thin film layers by the steps of: preparing a solution containing at least one kind of a material selected from the group consisting of a hole transport organic material, an electron transport organic material, and a luminescent organic material, followed by spraying the solution by using a pressurized gas, thereby forming at least one organic thin film layer; and forming the remaining organic thin film layer by a spin coating method, a vacuum deposition method or an ink jet printing method, where the former and latter steps are performed in a predetermined order.

In the method of the present invention, where the organic thin film is formed of two or more layers, the organic thin film layers are formed in a predetermined order such that the organic thin film layer containing a hole transport organic material is formed in contact with the anode, and the organic thin film layer containing an electron transport organic material is formed in contact with the cathode.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the present invention, and together with the general description given above and the detailed description of the preferred embodiments given below, serve to explain the principles of the present invention.

DETAILED DESCRIPTION OF THE INVENTION

Figure 2:
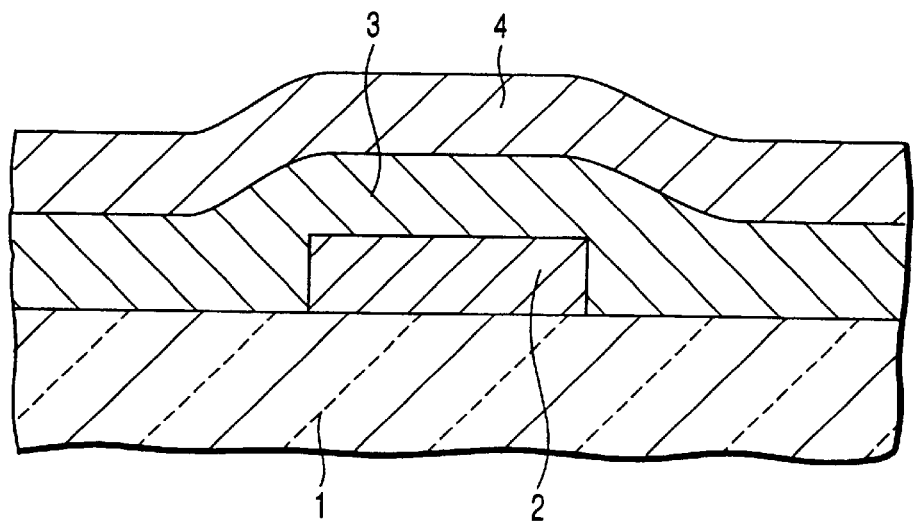
FIG. 2 is a cross-sectional view showing an example of an organic electroluminescent device.

FIG. 2 is a cross-sectional view showing an example of an organic electroluminescent device. As shown in the drawing, the organic electroluminescent device comprises a substrate 1. A first electrode 2, an organic thin film layer 3 and a second electrode 4 are successively formed on the substrate 1 in the order mentioned. FIG. 2 is directed to an organic electroluminescent device of a passive matrix type in which the first electrode 2 and the second electrode 4 are patterned in directions perpendicular to each other.

One of the first and second electrodes is an anode for injecting holes into the organic thin film layer and the other is a cathode for injecting electrons into the organic thin film layer. The luminescent organic material is excited by injection of carriers into the organic thin film layer, and emission is observed as a result of the recombination between the electrons and the holes. It is desirable for the organic electroluminescent device to be constructed such that the front side of the organic thin film layer where the emission is viewed is transparent to visible light and the backside of the organic thin film layer reflects visible light. It follows that it is conceivable for the substrate 1 and the first electrode 2 to be transparent and for the second electrode 4 to be reflective. Alternatively, it is conceivable for the second electrode 4 to be transparent and for the first electrode 2 to be reflective. Such being the situation, an anode made of a transparent conductive oxide and a cathode made of a reflective metal are used in combination in general as described in detail herein later.

A feature of the method of the present invention is that the organic thin film layer is formed by spraying a solution containing the materials forming the organic thin film layer by using a pressurized gas.

Figure 1:
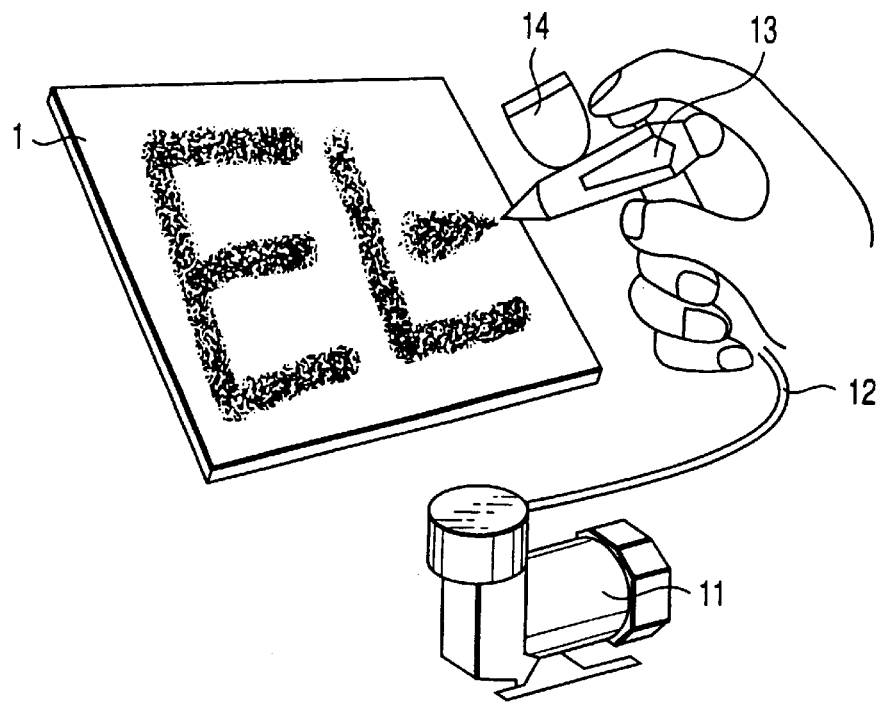
FIG. 1 is a perspective view showing a method of forming an organic thin film layer according to the present invention.

FIG. 1 shows an example of the method of the present invention for forming the organic thin film layer. The reference numeral 11 shown in FIG. 1 denotes a pressurizer, the reference numeral 12 denotes a pressurized gas tube, the reference numeral 13 denotes a sprayer, the reference numeral 14 denotes a liquid reservoir for storing a solution of the organic material, and the reference numeral 1 denotes a substrate. The gas pressurized to a predetermined pressure by the pressurizer 11 is introduced into the sprayer 13 through the pressurized gas tube 12. The pressurized gas is mixed with the solution of the organic material introduced from the liquid reservoir 14 within the sprayer 13 so as to be sprayed onto the substrate 1.

It is desirable to use a gas inert to the organic material such as nitrogen or argon. In the case of using a gas containing oxygen or water, the life of the manufactured device is markedly shortened.

FIG. 1 shows the state that a worker manually operates the sprayer for forming a pattern of an organic thin film layer. In view of the manufacture of a device on a substrate having a large area, it is possible to form the organic thin film layer by fixing the sprayer and moving the substrate in one direction by a belt conveyor system or a roll-to-roll system. In this case, it is possible to arrange a plurality of sprayers so as to form organic thin film layers having different emission color in the moving direction of the substrate. It is also possible to form an organic thin film layer having a single emission color by using a plurality of sprayers.

Further, it is possible to form a line provided with a gas flow for forming a stream of the solution or for promoting drying after spraying of the solution, and/or a hot plate for baking the organic thin film layer after spraying of the solution.

It is desirable for at least the surface of the substrate to exhibit insulating properties and to inhibit completely water permeation. Also, in order to suppress dark spots and to ensure a long life, it is desirable for the substrate surface after completion of a washing process to be free from absorption of water and oxygen. Therefore, where an organic electroluminescent device is manufactured on a trial basis, it is desirable to form the organic thin film within a glove box in, for example, an inert gas atmosphere. In the mode that the substrate and the first electrode are transparent and the second electrode is reflective as pointed out above, a transparent substrate such as a glass substrate is used. On the other hand, in the mode that the second electrode is transparent and the first electrode is reflective, it is possible to use as the substrate a metal plate having the surface covered with an insulating film or an opaque plastic plate resistant to a solvent.

It is desirable for the anode to have a high work function so as to permit sufficient injection of holes into the organic thin film layer and to be capable of transmitting visible light. It is also desirable for the anode to have a flat surface after the film formation and to be stable. Also, where the anode is formed on the substrate as the first electrode, it is desirable for the cross-sectional shape after the patterning to be trapezoid. Under the circumstances, it is possible to use a transparent conductive oxide such as ITO, which is a mixture of indium oxide and tin oxide, or IZO, which is a mixture of indium oxide and zinc oxide, for forming the anode.

It is desirable for the cathode to have a low work function in order to permit sufficient injection of electrons into the organic thin film layer and to be capable of reflecting visible light. It is also desirable for the cathode to have a flat surface after deposition and to be unlikely oxidized so as to be stable. Typical cathode materials include, for example, elemental metals such as Al and Er; alloys such as Mg—Ag, Al—Li, Al—Mg, and Cs—Te; and laminated metals such as Cs/Al, Mg/Al, $Cs_2O$/Al, LiF/Al, and $ErF_3$/Al.

The organic materials forming the organic thin film layer include a hole transport organic material, an electron transport organic material, and a luminescent organic material. It is also possible to use an organic material performing the luminescent and hole transport functions, an organic material performing the luminescent and electron transport functions, or an organic material performing the luminescent, electron transport and hole transport functions. In the case of using an organic material performing at least two of these functions, it is not absolutely necessary to use a hole transport organic material or an electron transport organic material. In the method of the present invention, it is desirable for at least one kind of the organic materials performing the functions described above to be an organic polymer material. Also, an organic solvent used for preparation of a solution of these organic materials is selected according to the solubility of each of the organic materials.

Typical examples of a hole transport organic polymer material include polyvinyl carbazole (PVCz), a polymer material having triphenyl amine on the main chain or the side chain, poly(3,4-oxyethylene-oxythiophene), poly(3,4-oxyethylene-oxythiophene), and poly(styrene sulfonate).

The electron transport organic material used in the present invention includes, for example, 2,5-bis-s-(1-naphtyl)-1,3,4-oxadiazole (BND).

The luminescent organic material (dye) used in the present invention includes coumarin 6 (C6) emitting a green light, perylene emitting a blue light, and 4-dicyanomethylene-6-cp-julolidinostyryl-2-tert-butyl-4H-pyran (DCJTB).

Typical examples of a polymer organic material performing the luminescent, electron transport and hole transport functions includes conjugated polymers such as poly(p-phenylenevinylene) (PPV) and poly (2-methoxy-5-(2'-ethylhexoxy)-1,4-phenylenevinylene (MEH-PPV).

Some of the luminescent organic materials are excited to a triplet state. In the case of using such a luminescent organic material, it is possible to use together an organic material having an energy gap larger than that of the luminescent organic material and not inhibiting emission from the excited triplet state, i.e., a host material. An example of an organic material that does not inhibit emission from the excited triplet state is 4,4'-bis(9-carbazole)biphenyl (CBP).

It is desirable for the electron transport organic material to be capable of blocking holes. However, it is possible to add an organic material capable of blocking holes to the electron transport organic material. The organic materials having hole blocking ability include, for example, 2,9-dimethyl-4,7-diphenyl-1,10-phenanthroline (BCP, bathocuproine) and 2-(4-biphenyl)-5-(p-tert-butylphenyl)-1,3,4-oxadiazole (tBu-PBD).

In the method of the present invention, it is possible to form one organic thin film layer or a stack of two or more organic thin film layers.

In the case of forming one organic thin film layer, a solution containing a hole transport organic material, an electron transport organic material, and a luminescent organic material is prepared first, followed by spraying the resultant solution by using a pressurized gas. In this method, it is possible to use an organic polymer material performing the luminescent, electron transport, and hole transport functions. This method can be applied to the case where an anode is formed on the substrate and a cathode is formed on the organic thin film layer and to the case where a cathode is formed on the substrate and an anode is formed on the organic thin film layer.

In the case of forming two organic thin film layers, it is possible to prepare a first solution containing a hole transport organic material and a second solution containing an electron transport organic material and a luminescent organic material, followed by spraying the first and the second solutions in a predetermined order so as to form an organic thin film layers consisting of a lower layer and an upper layer. Where an anode as the first electrode is formed on the substrate, for example, the first solution containing the hole transport organic material is sprayed by using a pressurized gas so as to form a lower organic thin film layer (hole transport layer). Then, the second solution containing the electron transport organic material and the luminescent organic material is sprayed by using a pressurized gas so as to form an upper organic thin film layer (light-emitting layer). In this step, it is possible to use an organic material performing the luminescent and electron transport functions. Thereafter, a cathode is formed on the upper organic thin film layer (light-emitting layer). On the other hand, where a cathode is formed on the substrate and an anode is formed on the organic thin film layer, the order of stacking the two organic thin film layers described above is reversed.

Also, in the case of forming two organic thin film layers, it is possible to prepare a first solution containing a hole transport organic material and a luminescent organic material and a second solution containing an electron transport organic material, followed by spraying the first and second solutions in a predetermined order by using a pressurized gas so as to form two organic thin film layers consisting of the lower layer and the upper layer. Where an anode as the first electrode is formed on the substrate, for example, the first solution containing a hole transport organic material and a luminescent organic material is sprayed first by using a pressurized gas so as to form the lower organic thin film layer (light-emitting layer). Incidentally, it is possible to use in this step an organic material performing the luminescent and hole transport functions. Then, the second solution containing an electron transport organic material is sprayed by using a pressurized gas so as to form the upper organic thin film layer (electron transport layer). Thereafter, a cathode is formed on the upper organic thin film layer (electron transport layer). On the other hand, where a cathode is formed on the substrate and an anode is formed on the organic thin film layer, the order of stacking the two organic thin film layers described above is reversed.

In the case of forming three organic thin film layers, a first solution containing a hole transport organic material, a second solution containing a luminescent organic material, and a third solution containing an electron transport organic material are prepared, followed by spraying these first to third solutions in a predetermined order by using a pressurized gas so as to form three organic thin film layers consisting of a lower layer, an intermediate layer and an upper layer. Where an anode as the first electrode is formed on the substrate, for example, the lower organic thin film layer (hole transport layer) is formed first by spraying the first solution containing a hole transport organic material by using a pressurized gas. Then, the intermediate organic thin film layer (light-emitting layer) is formed by spraying the second solution containing a luminescent organic material by using a pressurized gas. Next, the upper organic thin film layer (electron transport layer) is formed by spraying the third solution containing an electron transport organic material by using a pressurized gas. Thereafter, a cathode is formed on the upper organic thin film layer (electron transport layer). On the other hand, where a cathode is formed on the substrate and an anode is formed on the organic thin film, the order of stacking the three organic thin film layers described above is reversed.

In the case of forming two or three organic thin film layers as described above, it is desirable for the materials constituting the lower organic thin film layer not to be dissolved in the solvent used for preparing the solution of the material forming the upper organic thin film layer, though it is not absolutely necessary for the particular materials not to be dissolved in the particular solvent. Also, it has been confirmed by experience that, where the same organic thin film layer is laminated a plurality of times by using the same solution, the thickness of the newly formed organic thin film layer is less than twice the thickness of the organic thin film layer formed first in the initial stage of the lamination, and that the thickness of the newly formed organic thin film layer increases as the number of laminations increases.

Also, in the case of forming two or three organic thin film layers, it suffices to employ the method of spraying a solution by using a pressurized gas in forming at least one organic thin film layer, and it is possible for forming the remaining organic thin film layer to employ other method such as the spin coating method, the vacuum deposition method and the ink jet method.

The method of the present invention described above is not limited to the particular materials described above and can be applied to any organic electroluminescent device materials as far as the materials themselves are soluble in an organic solvent.

EXAMPLES

Some Examples of the present invention will now be described.

As the hole transport organic material, polyvinylcarbazole (PVCz) was used. Also, as the electron transport organic material, 2,5-bis-s-(1-naphtyl)-1,3,4-oxadiazole (BND) was used. Further, as luminescent organic materials, the following were used: coumarin 6 (C6) as the green-emitting organic material, perylene as the blue-emitting organic material, and 4-dicyanomethylene-6-cp-julolidinostyryl-2-tert-butyl-4H-pyran (DCJTB) as the red-emitting agent.

In order to find appropriate spraying conditions, a preliminary experiment was first conducted as follows. Specifically, a mixture consisting of PVCz, BND and any of three kinds of luminescent organic materials at a ratio of 160:40:1 was dissolved in 1,2-dichloroethane so as to prepare a solution containing 1% by weight of the mixture. The solution thus prepared was charged in the liquid reservoir of a sprayer (manufactured by Olympos Co., Ltd., trade name YOUNG-8). The substrate was moved relative to the sprayer, which was fixed, and the solution was sprayed onto the substrate by using nitrogen gas as a pressurized gas so as to form a thin organic film layer on the substrate. In this preliminary experiment, the gas pressure, the distance between the sprayer and the substrate, and the substrate moving speed were changed in various ways. Specifically, the gas pressure was set at 0.3, 0.4, 0.6, and 0.75 kgf/cm$^2$: the distance between the sprayer and the substrate was set at 10, 20, 30, 40, 50 and 100 mm; and the substrate moving speed was set at 6.25, 12.5, 25, and 50 mm/sec. It was confirmed that, where the gas pressure is 0.6 kgf/cm$^2$, for example, the spray supplying speed is 60 sec/cc.

The conditions of the organic thin film layers formed under the conditions given above were evaluated and classified as follows. The state that the organic thin film layer is satisfactory and can be used as an element is evaluated as "good". The state that the thickness of the organic thin film layer is non-uniform and cannot be used as an element, though it is possible to form an element, is evaluated as "acceptable". Further, the condition that an organic thin film layer is not formed in some portions so as to make the organic thin film layer discontinuous or markedly non-uniform is evaluated as "poor". Also, the thickness was measured in respect of the organic thin film layers evaluated as "good". Table 1 shows the results.

TABLE 1

| Gas pressure [kgf/cm$^2$] | Distance [mm] | Moving speed [mm/s] | Film condition | Thickness [nm] |
|---|---|---|---|---|
| 0.3 | 10 | 12.5 | poor | — |
| 0.3 | 20 | 12.5 | poor | — |
| 0.3 | 10 | 25 | acceptable | — |
| 0.3 | 20 | 25 | poor | — |

TABLE 1-continued

| Gas pressure [kgf/cm$^2$] | Distance [mm] | Moving speed [mm/s] | Film condition | Thickness [nm] |
|---|---|---|---|---|
| 0.3 | 10 | 50 | good | 79 |
| 0.3 | 20 | 50 | poor | — |
| 0.4 | 10 | 6.25 | acceptable | — |
| 0.4 | 20 | 6.25 | good | 87 |
| 0.4 | 30 | 6.25 | good | 83 |
| 0.4 | 40 | 6.25 | acceptable | — |
| 0.4 | 50 | 6.25 | poor | — |
| 0.4 | 10 | 12.5 | poor | — |
| 0.4 | 20 | 12.5 | acceptable | — |
| 0.4 | 30 | 12.5 | good | 104 |
| 0.4 | 40 | 12.5 | poor | — |
| 0.4 | 10 | 25 | poor | — |
| 0.4 | 20 | 25 | poor | — |
| 0.4 | 30 | 25 | poor | — |
| 0.4 | 40 | 25 | poor | — |
| 0.4 | 50 | 25 | poor | — |
| 0.6 | 10 | 6.25 | good | 101 |
| 0.6 | 20 | 6.25 | poor | — |
| 0.6 | 30 | 6.25 | poor | — |
| 0.6 | 10 | 12.5 | good | 111 |
| 0.6 | 20 | 12.5 | good | 113 |
| 0.6 | 30 | 12.5 | acceptable | — |
| 0.6 | 40 | 12.5 | acceptable | — |
| 0.6 | 10 | 25 | good | 86 |
| 0.6 | 20 | 25 | good | 78 |
| 0.6 | 30 | 25 | acceptable | — |
| 0.6 | 40 | 25 | acceptable | — |
| 0.6 | 50 | 25 | poor | — |
| 0.6 | 100 | 25 | poor | — |
| 0.6 | 10 | 50 | poor | — |
| 0.6 | 20 | 50 | poor | — |
| 0.75 | 10 | 6.25 | acceptable | — |
| 0.75 | 20 | 6.25 | poor | — |
| 0.75 | 30 | 6.25 | poor | — |
| 0.75 | 10 | 12.5 | poor | — |
| 0.75 | 20 | 12.5 | poor | — |
| 0.75 | 30 | 12.5 | poor | — |

Then, an organic electroluminescent device was fabricated such that an anode made of ITO, an organic thin film layer, and a cathode formed of an LiF/Al laminate were formed on a glass substrate so as to evaluate the device characteristics. Specifically, one line of the anode having a width of about 2 mm was formed first on the substrate, followed by forming the organic thin film layer in a manner to cover substantially the entire surface of the substrate followed by one line of the cathode having a width of about 2 mm in a direction perpendicular to the anode. The organic electroluminescent device was formed in the overlapping portion between the anode and the cathode and had an area of 2×2 mm$^2$.

Example 1

A mixture consisting of PVCz, BND and C6 mixed in a ratio of 160:40:1 was dissolved in 1,2-dichloroethane so as to prepare a solution containing 1% by weight of the mixture. The solution thus prepared was charged in the liquid reservoir of a sprayer and sprayed onto the substrate under the conditions that the nitrogen gas pressure was 0.6 kgf/cm$^2$, the distance between the sprayer and the substrate was 20 mm, and the substrate moving speed was about 20 mm/sec so as to form an organic thin film layer.

Example 2

A mixture consisting of PVCz, BND and perylene mixed in a ratio of 160:40:1 was dissolved in 1,2-dichloroethane so as to prepare a solution containing 1% by weight of the mixture. The solution thus prepared was charged in the liquid reservoir of a sprayer and sprayed onto the substrate under the conditions that the nitrogen gas pressure was 0.6 kgf/cm$^2$, the distance between the sprayer and the substrate was 20 mm, and the substrate moving speed was about 20 mm/sec so as to form an organic thin film layer.

Example 3

A mixture consisting of PVCz, BND and DCJTB mixed in a ratio of 160:40:1 was dissolved in 1,2-dichloroethane so as to prepare a solution containing 1% by weight of the mixture. The solution thus prepared was charged in the liquid reservoir of a sprayer and sprayed onto the substrate under the conditions that the nitrogen gas pressure was 0.6 kgf/cm$^2$, the distance between the sprayer and the substrate was 20 mm, and the substrate moving speed was about 20 mm/sec so as to form an organic thin film layer.

Figure 3:
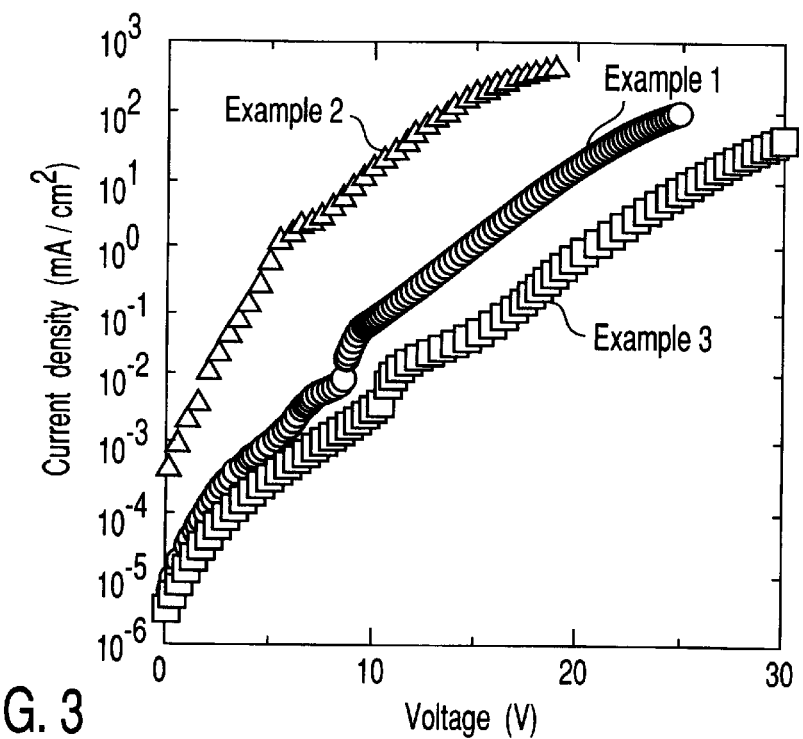
FIG. 3 is a graph showing the relationship between the current density and the voltage in respect of the organic electroluminescent devices for Examples 1 to 3 of the present invention.
Figure 4:
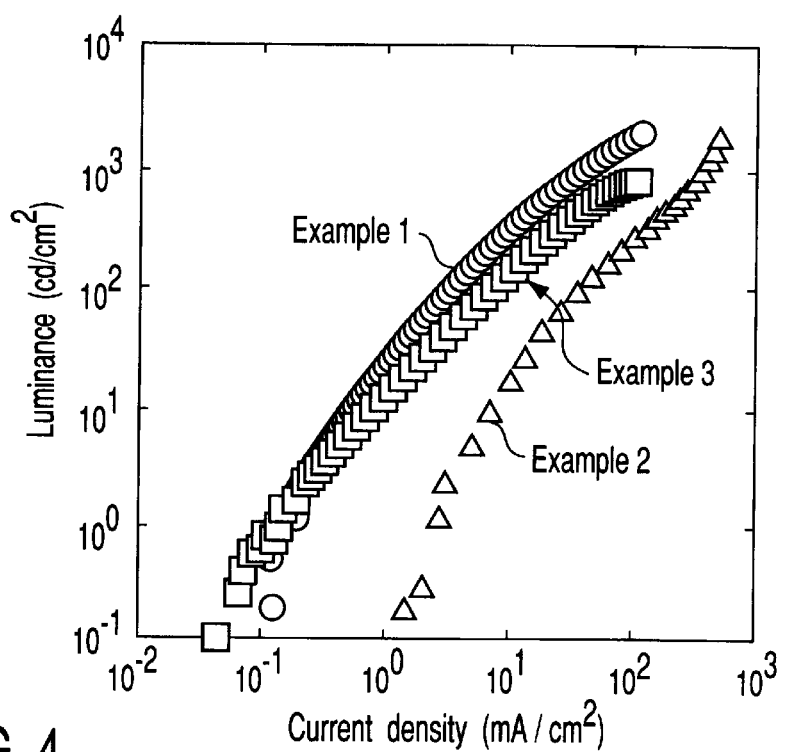
FIG. 4 is a graph showing the relationship between the luminance and the current density in respect of the organic electroluminescent devices for Examples 1 to 3 of the present invention.
Figure 5:
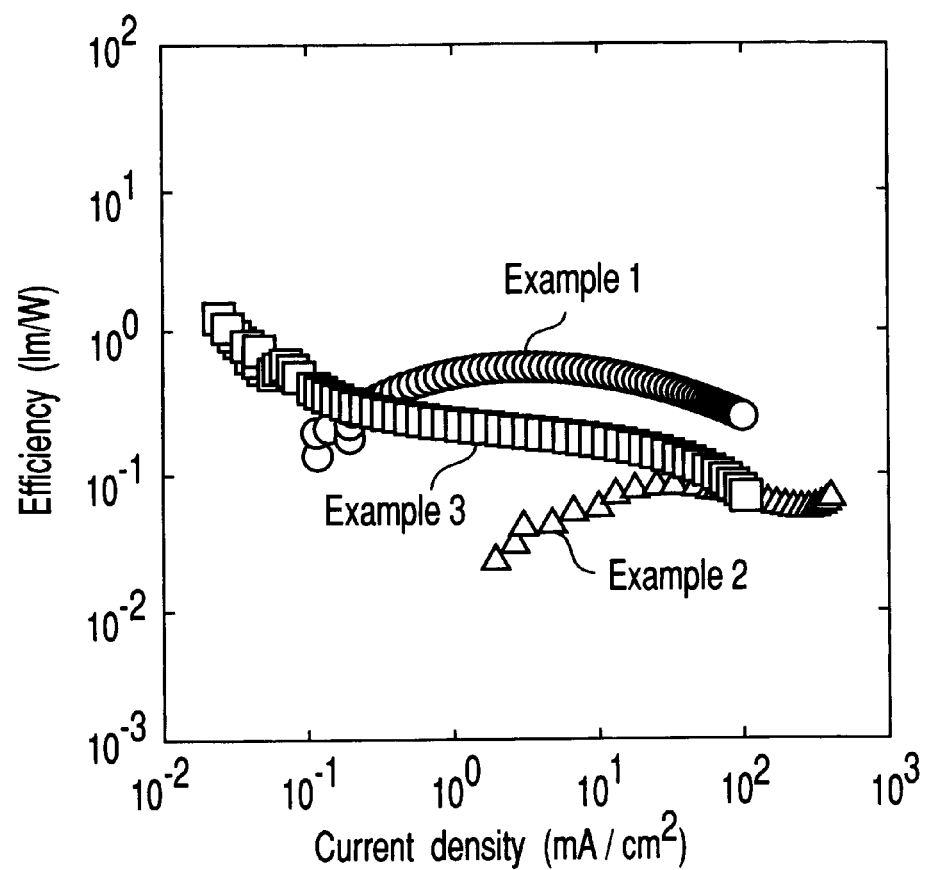
FIG. 5 is a graph showing the relationship between the efficiency and the current density in respect of the organic electroluminescent devices for Examples 1 to 3 of the present invention.

Emission was observed in all of the organic electroluminescent devices prepared in Examples 1 to 3. The relationships between the current density and the voltage, between the luminance and the current density, and between the efficiency and the current density were measured for each of the organic electroluminescent devices prepared in Examples 1 to 3. FIG. 3 is a graph showing the relationship between the current density and the voltage. FIG. 4 is a graph showing the relationship between the luminance and the current density. FIG. 5 is a graph showing the relationship between the efficiency and the current density.

The organic electroluminescent device for Example 1 using coumarin 6 as the light-emitting material exhibited a highest luminance of 1910 cd/cm$^2$ (current density of 103 mA/cm$^2$ and voltage of 25 V), and a highest efficiency of 0.48 cd/A (current density of 1.9 mA/cm$^2$ and voltage of 16 V).

The organic electroluminescent device for Example 2 using perylene as the light-emitting material exhibited a highest luminance of 1740 cd/cm$^2$ (current density of 472 mA/cm$^2$ and voltage of 20 V), and a highest efficiency of 0.070 cd/A (current density of 35.2 mA/cm$^2$ and voltage of 15 V).

The organic electroluminescent device for Example 3 using DCJTB as the light-emitting material exhibited a highest luminance of 745 cd/cm$^2$ (current density of 104 mA/cm$^2$ and voltage of 35 V), and a highest efficiency of 1.1 cd/A (current density of 0.025 mA/cm$^2$ and voltage of 13.2 V).

Example 4

On an anode made of ITO formed on a glass substrate, a first organic thin film layer was formed by spin-coating an aqueous solution containing 1.3% by weight of poly(3,4-oxyethylene oxythiophene)/poly(styrene sulfonate) used as a hole transport organic material. Also, a mixture consisting of PVCz, BND and C6 mixed in a ratio of 160:40:1 was dissolved in 1,2-dichloroethane so as to prepare a solution containing 1% by weight of the mixture. The solution thus prepared was charged in the liquid reservoir of a prayer and sprayed onto the substrate under the conditions that the nitrogen gas pressure was 0.6 kgf/cm$^2$, the distance between the sprayer and the substrate was 20 mm, and the substrate moving speed was about 20 mm/sec so as to form a second organic thin film layer.

The organic electroluminescent device for Example 4 using coumarin 6 as the light-emitting material exhibited a highest luminance of 1730 cd/cm$^2$ (current density of 221 mA/cm$^2$ and voltage of 23 V), and a highest efficiency of 0.47 cd/A.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing an organic electroluminescent device, comprising the steps of:

forming a first electrode on a substrate;

forming on the first electrode at least one organic thin film layer containing at least one kind of a material selected from the group consisting of a hole transport organic material, an electron transport organic material, and a luminescent organic material; and forming a second electrode on the organic thin film layer;

wherein the step of forming at least one organic thin film layer comprises the steps of:

preparing a solution containing at east one kind of a material selected from the group consisting of a hole transport organic material, an electron transport organic material, and a luminescent organic material;

spraying the solution onto the first electrode by using a pressurized gas; and forming a stream of the sprayed solution by a gas flow, followed by driving the sprayed solution.

2. The method according to claim 1, wherein one organic thin film layer is formed by the steps of:

preparing one kind of a solution containing a hole transport organic material, an electron transport organic material, and a luminescent organic material;

spraying the solution onto the first electrode by using a pressurized gas; and forming a stream of the sprayed solution by a gas flow, followed by driving the sprayed solution.

3. The method according to claim 1, wherein two organic thin film layers of a lower layer and an upper layer are formed by the steps of:

preparing a first solution containing a hole transport organic material and a second solution containing an electron transport organic material and a luminescent organic material;

spraying in a predetermined order the first and second solutions onto the first electrode by using a pressurized gas; and forming a stream of the sprayed solution by a gas flow, followed by driving the sprayed solution.

4. The method according to claim 1, wherein two organic thin film layers of a lower layer and an upper layer are formed by the steps of:

preparing a first solution containing a hole transport organic material and a luminescent organic material and a second solution containing an electron transport organic material;

spraying in a predetermined order the first and second solutions onto the first electrode by using a pressured gas; and forming a stream of the sprayed solution by a gas flow, followed by driving the sprayed solution.

5. The method according to claim 1, wherein three organic thin film layers of a lower layer, an intermediate layer, and an upper layer are formed by the steps of:

preparing first, second and third solutions containing a hole transport organic material, a luminescent organic material and an electron transport organic material, respectively;

spraying in a predetermined order the first to third solutions onto the first electrode by using a pressurized gas; and forming a stream of the sprayed solution by a gas flow, followed by driving the sprayed solution.

6. The method according to claim 1, wherein two or more organic thin film layers are formed by the steps of:

preparing a solution containing at least one kind of a material selected from the group consisting of a hole transport organic material, an electron transport organic material, and a luminescent organic material, followed by spraying the solution by using a pressurized gas, thereby forming at least one organic thin film layer;

forming the remaining organic thin film layer by a spin coating method, a vacuum deposition method or an ink jet printing method, where the former and latter steps are performed in a predetermined order; and forming a stream of the sprayed solution by a gas flow, followed by driving the sprayed solution.

7. The method according to claim 1, wherein the hold transport organic material is selected from the group consisting of polyvinylcarbazole and a polymer material having triphenyl amine on a main chain or a side chain.

8. The method according to claim 1, wherein the luminescent organic material is excited to a triplet state.

9. The method according to claim 1, wherein the solution containing the electron transport organic material further contains an organic material having hole blocking ability.

10. The method according to claim 1, wherein the substrate is transparent to visible light and is insulating, the first electrode is transparent to visible light, and the second electrode is reflective to visible light.

11. The method according to claim 1, wherein the substrate has an insulating surface, the first electrode is reflective to visible light, and the second electrode is transparent to visible light.

* * * * *